(12) United States Patent
Hori

(10) Patent No.: US 6,469,398 B1
(45) Date of Patent: Oct. 22, 2002

(54) SEMICONDUCTOR PACKAGE AND MANUFACTURING METHOD THEREOF

(75) Inventor: Tetsuji Hori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,730

(22) Filed: Mar. 21, 2002

(30) Foreign Application Priority Data

Mar. 29, 2001 (JP) ........................................ 2001-096280

(51) Int. Cl.⁷ ................................................ H01L 23/28
(52) U.S. Cl. ........................ 257/796; 257/707; 257/706
(58) Field of Search ................................ 257/796, 706, 257/707, 784, 735, 736, 737, 787

(56) References Cited

U.S. PATENT DOCUMENTS

| | | | |
|---|---|---|---|
| 5,157,475 A | * | 10/1992 | Yamaguchi |
| 5,157,480 A | * | 10/1992 | McShane et al. |
| 5,172,214 A | * | 12/1992 | Casto |
| 5,521,429 A | * | 5/1996 | Aono et al. |
| 5,900,676 A | * | 5/1999 | Kwoen et al. |
| 5,973,388 A | * | 10/1999 | Chew et al. |
| 5,977,613 A | * | 11/1999 | Takata et al. |
| 6,040,626 A | | 3/2000 | Cheah et al. |
| 6,075,284 A | * | 6/2000 | Choi et al. |
| 6,191,494 B1 | * | 2/2001 | Ooyama et al. |
| 6,198,171 B1 | * | 3/2001 | Huang et al. |
| 6,208,023 B1 | * | 3/2001 | Nakayama et al. |
| 6,240,554 B1 | * | 3/2001 | Ewer et al. |
| 6,230,399 B1 | * | 5/2001 | Maheshwari et al. |
| 6,242,797 B1 | * | 6/2001 | Ichikawa et al. |
| 6,281,568 B1 | * | 8/2001 | Glenn et al. |
| 6,388,340 B2 | * | 5/2002 | Distafano |

FOREIGN PATENT DOCUMENTS

| | | |
|---|---|---|
| JP | 2000-82721 | 3/2000 |
| JP | 2000-307017 | 11/2000 |

* cited by examiner

Primary Examiner—Sheila V. Clark
(74) Attorney, Agent, or Firm—Oblon, Spivak, McClelland, Maier & Neustadt, P.C.

(57) ABSTRACT

A semiconductor package includes a semiconductor chip. The semiconductor chip includes first and second electrodes disposed on a top side, and a third electrode disposed on a bottom side. A heat spreader is bonded to the third electrode. First and second conductive leads are electrically connected to the first and second electrodes through first and second conductive bonding members, respectively. The first and second leads respectively include foot portions at their lower ends, which are juxtaposed on a first side of the heat spreader. The heat spreader and the foot portions of the first and second leads have bottom faces, which are exposed on the bottom of an insulating sealing body, and are disposed on the same plane.

28 Claims, 10 Drawing Sheets

SEMICONDUCTOR PACKAGE AND MANUFACTURING METHOD THEREOF

CROSS-REFERENCE TO RELATED APPLICATIONS

This application is based upon and claims the benefit of priority from the prior Japanese Patent Application No. 2001-096280, filed Mar. 29, 2001, the entire contents of which are incorporated herein by reference.

BACKGROUND OF THE INVENTION

1. Field of the Invention

The present invention relates to a semiconductor package with a semiconductor chip disposed therein and containing, for example, a vertical type MOS transistor, and a manufacturing method thereof.

2. Description of the Related Art

FIG. 17A is a plan view diagram showing a conventional semiconductor package with a power semiconductor chip disposed therein and containing a vertical type MOS transistor. FIGS. 17B and 17C are sectional view diagrams of the semiconductor package shown in FIG. 17A, in the longitudinal direction and a direction perpendicular thereto, respectively.

As shown in FIGS. 17A to 17C, a power semiconductor chip 102 is mounted on a device-mounting portion (bed portion) 110 of a lead frame 101 through a solder layer 103. The lead frame 101 is made of a material, such as Cu, a Cu alloy, Fe-42Ni alloy. The lead frame 101 includes the bed portion 110, a first lead 111, a second lead 112, and a third lead 113 integrally connected to the bed portion 110. The chip 102 includes a MOS transistor formed of a source region, a base region, a drain region, a gate electrode, and so forth.

A metal electrode 107a of, e.g., Al, and a metal electrode 107b of, e.g., Au or Al are disposed on the top side of the chip 102. The metal electrode 107a is electrically connected to the source region and the base region through a source electrode (including a source lead-out electrode). The metal electrode 107b is electrically connected to the gate electrode (including a gate lead-out electrode).

The metal electrodes 107a and 107b of the chip 102 are electrically connected to the first and second leads 111 and 112 through bonding wires 116 and 114 of, e.g., an Au wire. The chip 102, the bed portion 110, the proximal portions of the first, second, and third leads 111 to 113, and the bonding wires 116 and 114 are resin-sealed by a resin sealing body 105 of, e.g., epoxy resin.

The conventional semiconductor package shown in FIGS. 17A to 17C entails the following problems. A plurality of Au wires are used for a chip containing a power semiconductor device, such as a vertical type MOS transistor, to reduce the wiring resistance due to the Au wires. In this case, the number of indexes of assembling steps increases with an increase in the number of electrode pads and thus with an increase in the number of connecting Au wires. Furthermore, it is difficult to further reduce the wiring resistance by design due to the wire length.

On the other hand, a power semiconductor chip requires a good heat-discharge property to be ensured. In light of the heat-discharge property, it is preferable to increase the thickness of the bed portion of a lead frame on which the chip is mounted. In this case, however, the thickness of the lead frame itself needs to be increased, thereby making the entire semiconductor package bulky. Where the lead frame is formed to have a larger thickness only at the bed portion, the product cost of the lead frame remarkably increases. Accordingly, such a lead frame could not be used for a package product in practice.

U.S. Pat. No. 6,040,626 discloses a structure in which a first lead is directly bonded to a semiconductor chip of a vertical type MOS transistor by a conductive bonding material to reduce the wiring resistance. In this structure, however, the heat-discharge property of the semiconductor chip is hardly improved, but the lead projecting from a resin sealing body prevents the package from being compact.

Accordingly, there are demands for a semiconductor package, the entire size of which does not have to be increased, even where it has a semiconductor chip with a larger current rating, such as a power semiconductor chip containing a vertical type MOS transistor.

BRIEF SUMMARY OF THE INVENTION

According to a first aspect of the present invention, there is provided a semiconductor package, comprising:
a semiconductor chip including first and second electrodes disposed on a top side, and a third electrode disposed on a bottom side;
a heat spreader bonded to the third electrode;
first and second conductive leads electrically connected to the first and second electrodes through first and second conductive bonding members, respectively, the first and second leads respectively including foot portions, which laterally extend at lower ends of the first and second leads and are juxtaposed on a first side of the heat spreader; and
an insulating sealing body arranged to embed and seal therein the semiconductor chip, the heat spreader, and portions of the first and second leads, which extend from the first and second bonding members to at least part of the foot portions, the heat spreader and the foot portions of the first and second leads having bottom faces, which are exposed on a bottom of the sealing body, and are disposed on substantially the same plane.

According to a second aspect of the present invention, there is provided a method of manufacturing a semiconductor package comprising:
bonding a heat spreader to a third electrode of a semiconductor chip, which includes first and second electrodes disposed on a top side, and the third electrode disposed on a bottom side
electrically connecting first and second conductive leads to the first and second electrodes by first and second conductive bonding members, respectively, the first and second leads respectively including foot portions, which laterally extend at lower ends of the first and second leads and are juxtaposed on a first side of the heat spreader; and
forming an insulating sealing body to embed and seal therein the semiconductor chip, the heat spreader, and portions of the first and second leads, which extend from the first and second bonding members to at least part of the foot portions, the heat spreader and the foot portions of the first and second leads having bottom faces, which are exposed on a bottom of the sealing body, and are disposed on substantially the same plane.

According to a third aspect of the present invention, there is provided a semiconductor package, comprising:
a semiconductor chip including first and second electrodes disposed on a top side, and a third electrode disposed on a bottom side;

a conductive heat spreader bonded to the third electrode, the heat spreader being electrically connected to the third electrode through a third conductive bonding member, and functioning as a third lead;

first and second conductive leads electrically connected to the first and second electrodes through first and second conductive bonding members, respectively, wherein each of the first and second leads is formed of a conductive strip, and the heat spreader has a thickness t1 and the conductive strip has a thickness t2 to satisfy a thickness ratio condition of $1<t1/t2\leq3$, wherein each of the first and second leads comprises a proximal portion facing the top side of the semiconductor chip, a leg portion bending from the proximal portion and extending along a flank of the semiconductor chip and the heat spreader, and a foot portion bending from the leg portion and extending away from the heat spreader, and wherein the foot portions of the first and second leads are juxtaposed on a first side of the heat spreader; and an insulating sealing body arranged to embed and seal therein the semiconductor chip, the heat spreader, and all the proximal portions and the leg portions of the first and second leads, and at least part of the foot portions of the first and second leads, wherein the sealing body consists essentially of a material selected from the group consisting of thermosetting resins including epoxy resin, and wherein the heat spreader and the foot portions of the first and second leads have bottom faces, which are exposed on a bottom of the sealing body, and are disposed on substantially the same plane.

DETAILED DESCRIPTION OF THE INVENTION

Embodiments of the present invention will be described hereinafter with reference to the accompanying drawings.

First Embodiment

Figure 1A:
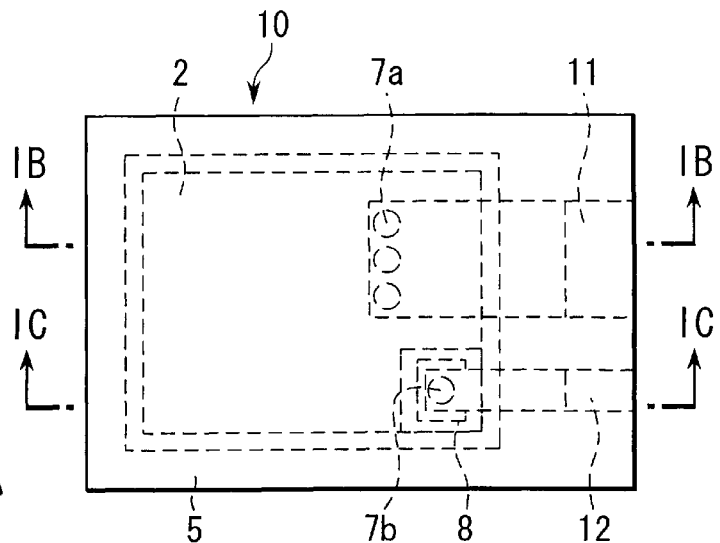
FIG. 1A is a plan view showing a semiconductor package with a power semiconductor chip disposed therein and containing a vertical type MOS transistor, according to a first embodiment of the present invention.
Figure 1B:
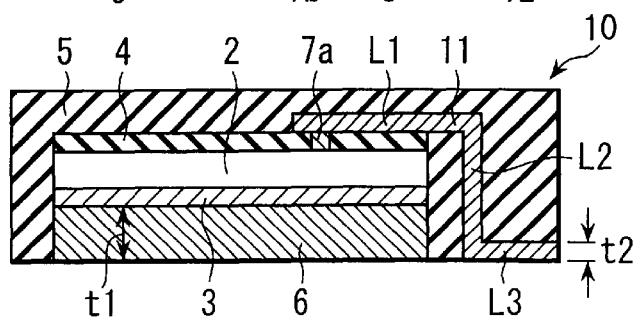
FIGS. 1B and 1C are sectional views taken along lines IB—IB and IC—IC in FIG. 1A, respectively.
Figure 1C:
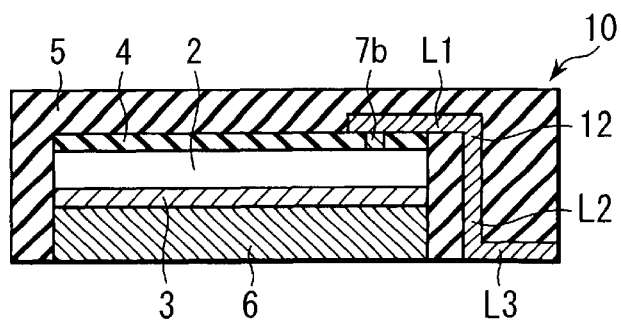
Figures 2A, 2B:
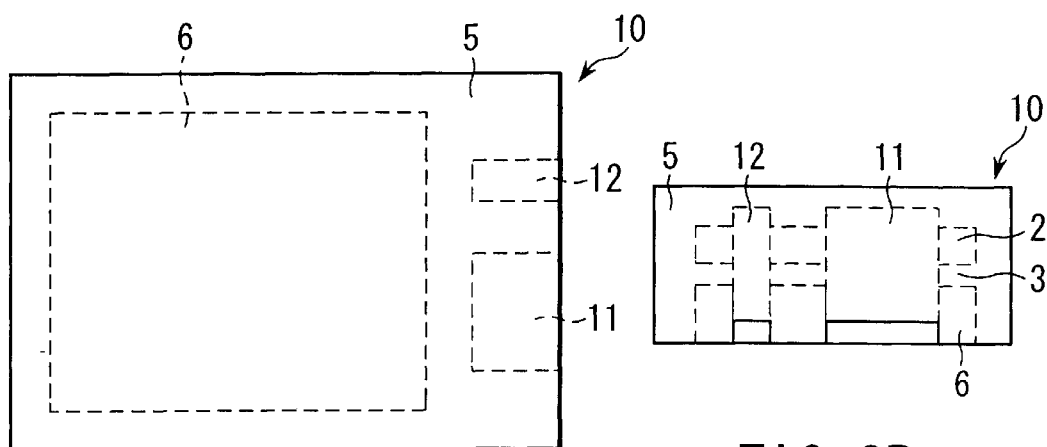
FIGS. 2A and 2B are a bottom view and a side view on a side where leads are formed, of the semiconductor package shown in FIG. 1A, respectively.

FIG. 1A is a plan view showing a semiconductor package with a power semiconductor chip disposed therein and containing a vertical type MOS transistor, according to a first embodiment of the present invention. FIGS. 1B and 1C are sectional views taken along lines IB—IB and IC—IC in FIG. 1A, respectively. FIGS. 2A and 2B are a bottom view and a side view on a side where leads are formed, of the semiconductor package shown in FIG. 1A, respectively.

A semiconductor package 10 according to this embodiment has a power semiconductor chip 2 containing a vertical type MOS transistor. As will be described later, a source electrode (including a source lead-out electrode) and a gate lead-out electrode 8 are disposed on the top side of the chip 2. A drain electrode is disposed on the bottom side of the chip 2. The semiconductor chip 2 is mounted on a heat spreader 6 through a solder layer (a conductive bonding member) 3.

Bump contacts (conductive bonding members) 7a and 7b made of a conductive material, such as Au, are disposed on the source electrode 15 and the gate lead-out electrode 8, respectively. First and second leads 11 and 12 each formed of a conductive strip are bonded to the bump contacts 7a and 7b, respectively. Consequently, the first lead 11 is electrically connected to the source electrode through the bump contact 7a. The second lead 12 is electrically connected to the gate lead-out electrode 8 through the bump contact 7b. Since the heat spreader 6 is electrically connected to the drain electrode on the bottom side of semiconductor chip 2 through the solder layer 3, it functions as a third lead.

The heat spreader 6 is formed of a plate member of Cu, Mo, W, or the like, or a laminated plate member of, e.g., CKC material (Cu/Kovar/Cu). The conductive strip of each of the first and second leads 11 and 12 is made of Cu, a Cu alloy, or the like. The thickness t1 of the heat spreader 6 is larger than the thickness t2 of the conductive strip of each of the first and second leads 11 and 12 (t1>t2). The thickness t1 of the heat spreader 6 is set to fall in a range of from 0.15 to 0.5 mm, and preferably of from 0.15 to 0.3 mm. The thickness t2 of the lead conductive strip is set to fall in a range of from 0.1 to 0.3 mm, and preferably of from 0.12 to 0.15 mm. The ratio (t1/t2) of the thickness t1 of the heat spreader 6 relative to the thickness t2 of the lead conductive strip is set to satisfy 1<t1/t2≦3. With this arrangement, the chip 2 can have a good heat-discharge property through the heat spreader 6. In this embodiment, for example, the thickness t1 of the heat spreader 6 is about 0.3 mm, while the thickness t2 of the lead conductive strip is about 0.15 mm.

Each of the first and second leads 11 and 12 has a proximal portion L1, a leg portion L2, and a foot portion L3. The proximal portion L1 faces the top surface of the chip 2 in parallel (horizontally). The leg portion L2 bends from the proximal portion L1 and vertically extends along the flank of the semiconductor chip 2 and the heat spreader 6. The foot portion L3 bends from the leg portion L2 and horizontally extends away from the heat spreader 6. The first and second leads 11 and 12 are guided only to the same side of the heat spreader 6, so that their foot portions L3 are laterally juxtaposed on this side.

In this embodiment the bent angles between the proximal portion L1, the leg portion L2, and the foot portion L3 are set to be about 90°. This arrangement facilitates the semiconductor package 10 being compact. Conventional semiconductor packages assign each lead a supporting function, the leg portion of the lead (corresponding the leg portion L2 shown in FIG. 1B) is disposed to form a large angle relative to the horizontal plane (the mount face of the package). On the other hand, in the semiconductor package 1 according to this embodiment, the leg portion L2 of each lead is disposed to form an angle of 90°±10°, and preferably of 90°±5°, relative to the horizontal plane (the mount face of the package).

An insulating sealing body 5 is arranged to embed and seal therein the semiconductor chip 2, the solder layer 3, the heat spreader 6, the first and second leads 11 and 12, the bump contacts 7a and 7b, and so forth. The sealing body 5 consists essentially of a material selected from the group consisting of thermosetting resins, such as epoxy resin. The bottom face of the heat spreader 6, and the bottom faces of the foot portions L3 of the first and second leads 11 and 12 are exposed on the bottom of the sealing body 5. The bottom faces of the members 6, L3, and 5 are disposed on substantially the same horizontal plane (the mount face of the package).

The toe of the foot portion L3 of each of the first and second leads 11 and 12 may be exposed on the side surface of the sealing body 5. With this arrangement, it is possible to visually confirm the bonding condition of the first and second leads 11 and 12 relative to a circuit board, when the semiconductor package 10 is mounted. The projecting length d (see FIG. 4) of the toe of the foot portion L3 is set to fall in a range of from 0 to 0.3 mm, and preferably of from 0.1 to 0.2 mm. Instead of this arrangement, where a transparent sealing body of a resin or the like is used, it is possible to visually confirm the bonding condition of the first and second leads 11 and 12.

Figure 3:
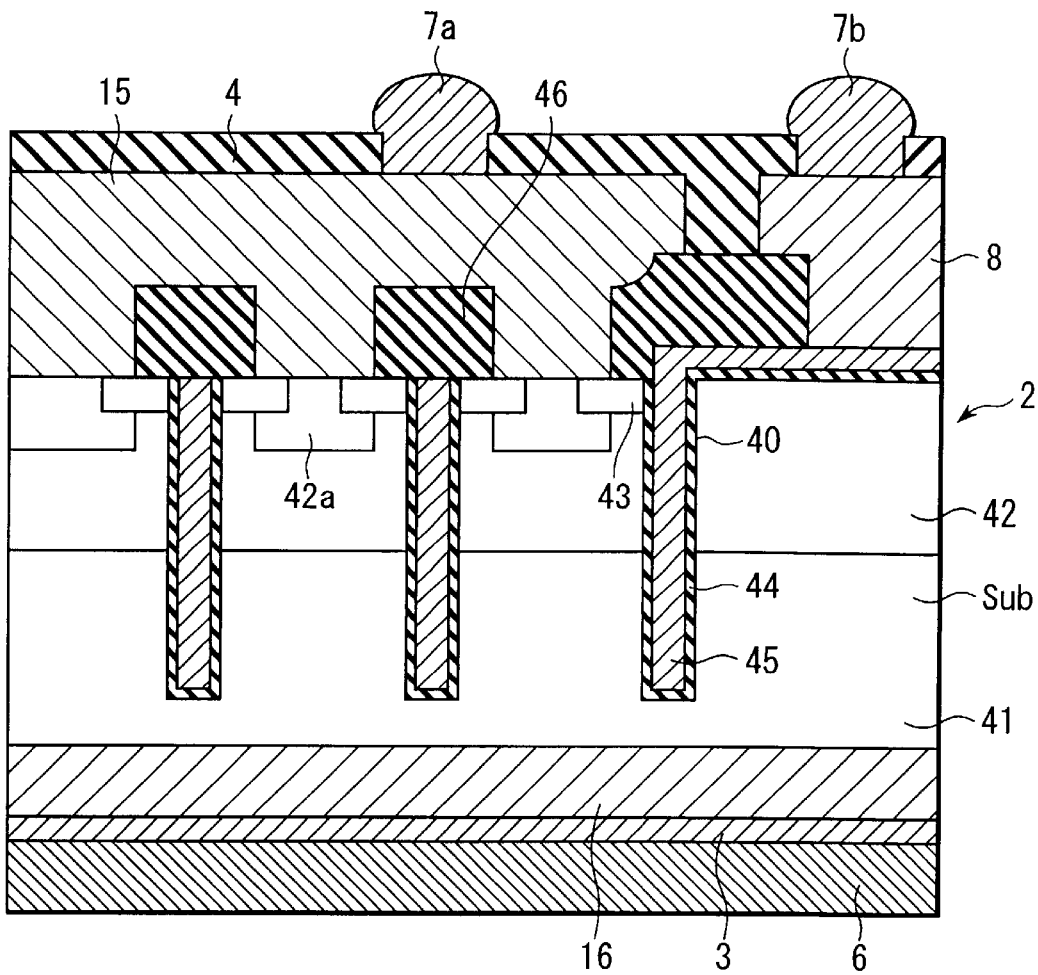
FIG. 3 is a sectional view showing the internal structure of the semiconductor chip in the semiconductor package shown in FIG. 1A.
Figure 4:
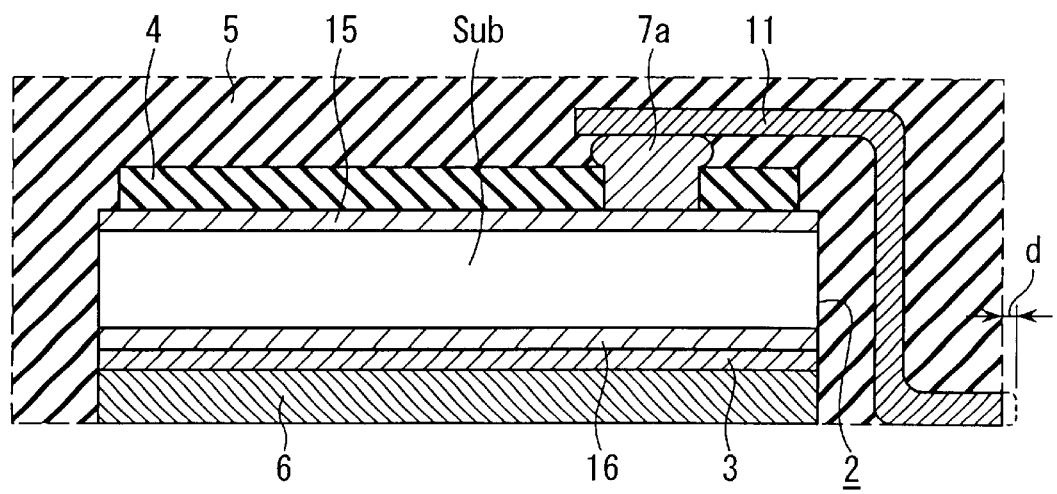
FIG. 4 is a sectional view showing the relationship between the semiconductor chip, a heat spreader, and a first lead in the semiconductor package shown in FIG. 1A.

FIG. 3 is a sectional view showing the internal structure of the semiconductor chip 2 in the semiconductor package 10. FIG. 4 is a sectional view showing the relationship between the semiconductor chip 2, the heat spreader 6, and the first lead 11.

The chip 2 is formed, using an n-silicon semiconductor substrate Sub, for example. A p-base region 42 is formed in the surface of the substrate Sub. N-source regions 43 are formed in the surface of the p-base region 42. P-contact regions 42a are also formed in the surface of the p-base region 42. The part of the substrate Sub on the bottom side, where no p-base region 42 is formed, is an n-drain region 41.

A plurality of trenches 40 are formed to vertically extend downward from the surface of the substrate Sub. The trenches 40 penetrate the n-source region 43 and the p-base region 42, and reach a certain depth in the drain region 41. Specifically, the bottoms of the trenches 40 are formed in the drain region 41. A gate insulating film 44, such as a silicon oxide film formed by, e.g., thermal oxidation is disposed on the inner side wall of each trench 40. The gate insulating film 44 essentially extends up to the opening end of the trench 40. The gate insulating film 44, however, may be terminated by, e.g., etching at a position slightly lower than the main surface of the substrate Sub. A gate electrode 45 of, e.g., poly-crystalline silicon is buried in each trench 40 and covered with the gate insulating film 44. An inter-level insulating film 46 is formed on the substrate Sub to close the openings of the trenches 40, i.e., to cover the top portions of the gate electrode 45 and the gate insulating film 44. The inter-level insulating film 46 is made of a material having a high re-flow property, such as BPSG, so that its surface is planarized by re-flow.

The gate electrode 45 is electrically connected to the gate lead-out electrode 8, which is formed on the main surface of the substrate Sub and made of aluminum or the like. The source electrode 15 is formed on the inter-level insulating film 46 and made of aluminum or the like. The source electrode 15 is electrically connected to the n-source regions 43 and the p-contact regions 42a through a contact hole formed in the interlevel insulating film 46. A barrier metal layer formed of, e.g., a TiW film may be disposed between the source electrode 15 and each of the n-source regions 43 and the p-contact regions 42a. A passivation film 4 formed of, e.g., a silicon nitride film for covering and protecting the chip 2 is disposed on the source electrode 15 and the gate lead-out electrode 8. On the other hand, a drain electrode 16 is disposed on the bottom side of the substrate Sub, and electrically connected to the drain region 41.

As described above, the first and second leads 11 and 12 are electrically connected to the source electrode 15 and the gate lead-out electrode 8 by the bump contacts 7a and 7b, respectively. The heat spreader 6 is electrically connected to the drain electrode 16 by the solder layer 3. As shown in FIG. 4, the bump contacts 7a and 7b are bonded to the source electrode 15 and the gate lead-out electrode 8 in openings of the passivation film 4, and project upward from the passivation film 4. Each of the bump contacts 7a and 7b has a sectional area of from 0.007 to 0.07 mm². The ends of the proximal portions L1 of the first and second leads 11 and 12 extend toward the center of the chip 2 beyond the bump contacts 7a and 7b.

Figures 5, 10:
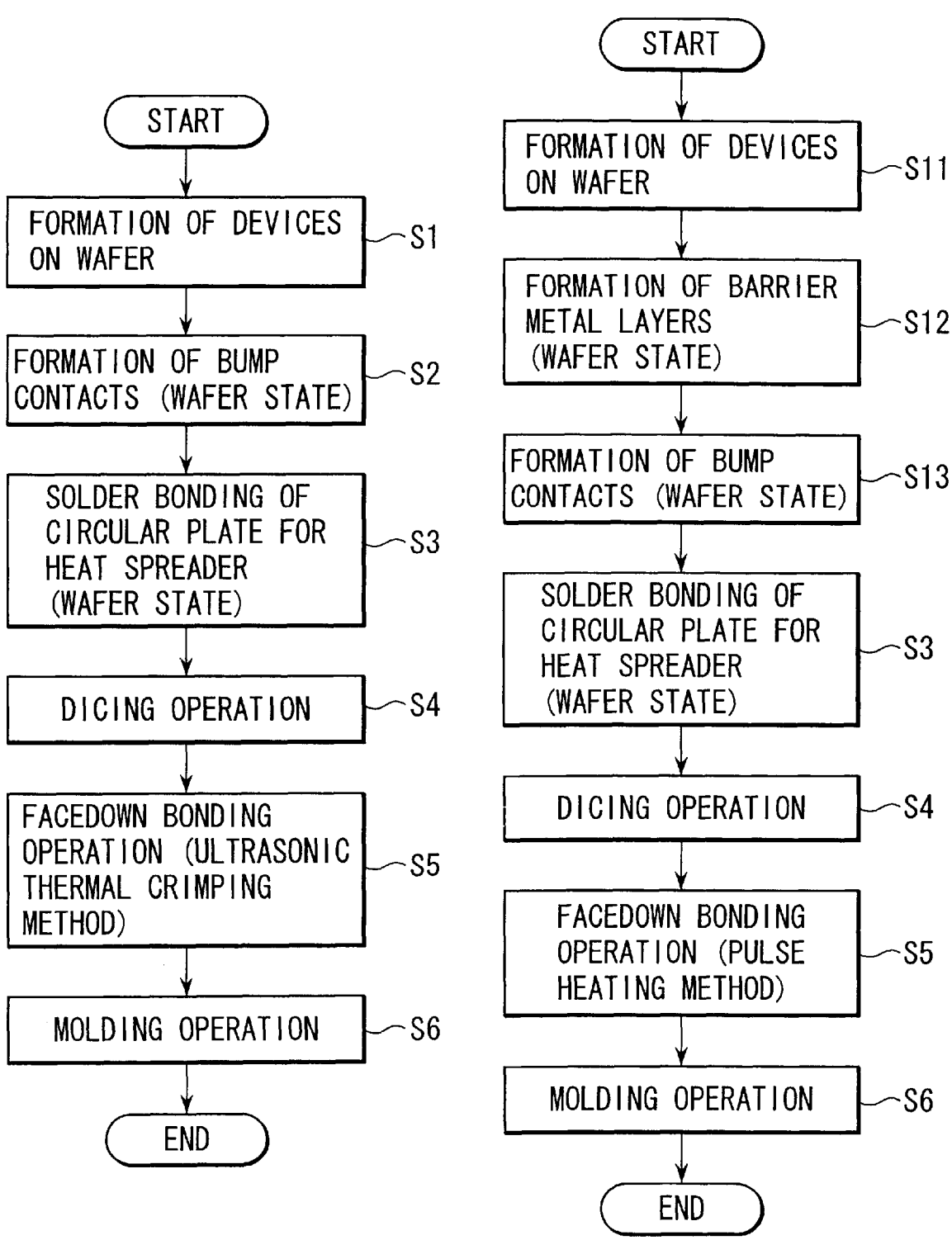
FIG. 5 is a flowchart showing a method of manufacturing a semiconductor package according to the first embodiment.
FIG. 10 is a flowchart showing a method of manufacturing a semiconductor package according to the second embodiment.

FIG. 5 is a flowchart showing a method of manufacturing a semiconductor package according to the first embodiment. FIGS. 6A to 6E are views showing the process of workpieces in the manufacturing method according to the flowchart shown in FIG. 5.

Figure 6A:
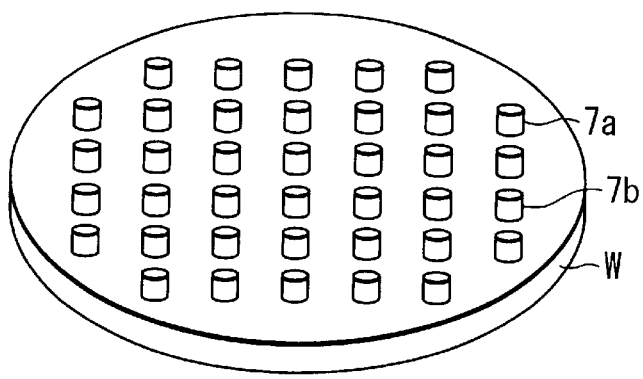
FIGS. 6A to 6E are views showing the process of workpieces in the manufacturing method according to the flowchart shown in FIG. 5.

First, a semiconductor wafer W of, e.g., silicon is prepared. On the wafer W, semiconductor devices each having a structure as described above are formed, i.e., a number of portions each functioning as a vertical type MOS transistor are formed (step S1). Then, bump contacts 7a and 7b made of a conductive material, such as Au, are formed on those portions of the wafer W, which correspond to the source electrode and the gate lead-out electrode of the respective semiconductor devices (step S2: FIG. 6A). The bump contacts 7a and 7b may be formed by a method of utilizing a stud bump holder, a method of utilizing plating, or the like.

Figure 6B:
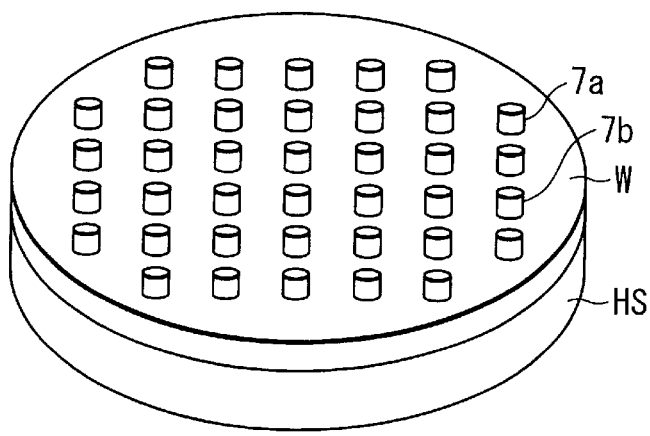

Then, a circular plate HS used as the material of a heat spreader is solder-bonded to the bottom of the wafer W, i.e., the drain electrode of the semiconductor devices (step S3: FIG. 6B). At this time, a solder layer may be disposed on the bottom of the wafer W in advance by vapor deposition, or may be disposed on the circular plate HS for a heat spreader in advance by plating. Instead of the bonding performed in a wafer state, a bonding operation may be performed in a chip state after a dicing operation.

Figure 6C:
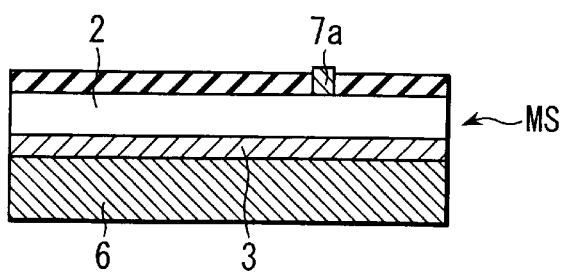

Then, the wafer W is subjected to a dicing operation along with the circular plate HS for a heat spreader. As a result, there are produced a number of separate intermediate structures MS, each of which has a semiconductor chip 2 and a heat spreader 6 bonded to each other by a solder layer 3 (step S4: FIG. 6C).

Figure 6D:
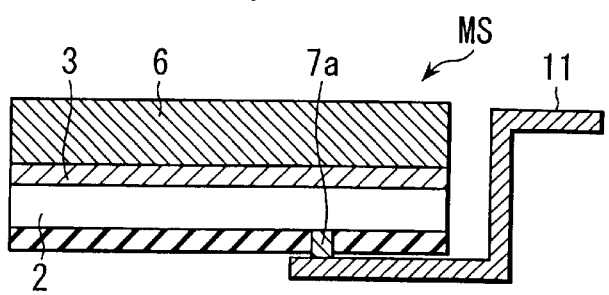
Figure 7:
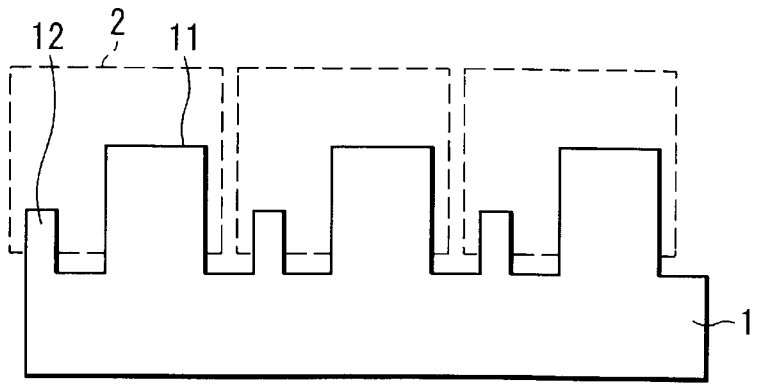
FIG. 7 is a bottom view showing the relationship between a chip and a lead frame used as the material of first and second leads, in a facedown bonding operation.

Then, the intermediate structure MS is boned to a lead frame used as the material of first and second leads 11 and 12 (step S5: FIG. 6D). At this time, the chip 2 is made upside down, i.e., the main surface of the chip 2 (the side on which the bump contacts 7a and 7b are arranged) is positioned at the bottom, so as to perform a facedown bonding operation. FIG. 7 is a bottom view showing the relationship between the chip 2 and the lead frame used as the material of the first and second leads 11 and 12, in the facedown bonding operation. For example, an ultrasonic thermal crimping method is used as a bonding method at this time. In this case, the lead frame 1 is formed of a PPF (Pre-Plating Lead Frame) with plating, for example. The plating is made of a material of, e.g., Ni/Pd/Au.

Figure 6E:
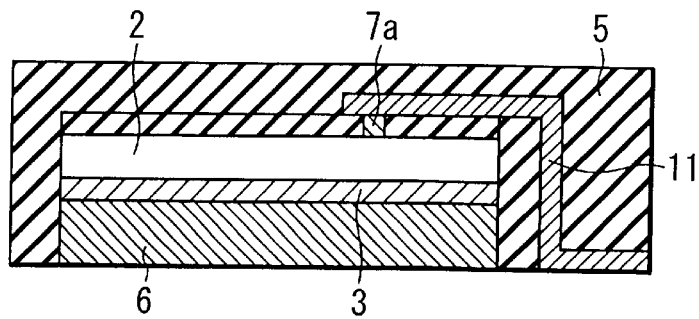

Then, the resultant structure obtained in the step described above is provided with an insulating sealing body 5, which is formed by, e.g., a molding operation (step S6: FIG. 6E). The material of the sealing body 5 is selected from the group consisting of thermosetting resins, such as epoxy resin, for example. The semiconductor chip 2, the solder layer 3, the heat spreader 6, and the first and second leads 11 and 12 are embedded and sealed in the sealing body 5 thus formed. In this resin-sealed state, the bottom face of the heat spreader 6, and the bottom faces of the foot portions L3 of the first and second leads 11 and 12 are exposed on the bottom of the sealing body 5. The bottom faces of the members 6, L3, and 5 are disposed on substantially the same horizontal plane (the mount face of the package).

As described above, in the manufacturing method of a semiconductor package 10 according to the first embodiment, the semiconductor chip 2 is mounted on the heat spreader 6, and is then facedown bonded to the lead frame 1 by the bump contacts 7a and 7b. As a result, it is possible to reduce the wiring resistance and thermal resistance, which are obstacles in the properties of conventional semiconductor packages in which a semiconductor chip is mounted on a lead frame.

In the semiconductor package 10 according to the first embodiment, the terminal portion of the third lead (the drain lead) formed of the heat spreader 6, and the terminal portions of the first and second leads (the source and gate leads) 11 and 12 juxtaposed on one side of the heat spreader 6 are disposed on substantially the same horizontal plane (the mount face of the package) at the bottom of the sealing body 5. With this arrangement, it is possible to remarkably reduce the package size, as compared to conventional semiconductor packages, in which a plurality of leads extend out from the opposite sides of a resin sealing body. Furthermore, a plurality of semiconductor chips with a larger current rating can be contained in the same package, thereby improving the area efficiency.

Second Embodiment

Figure 8:
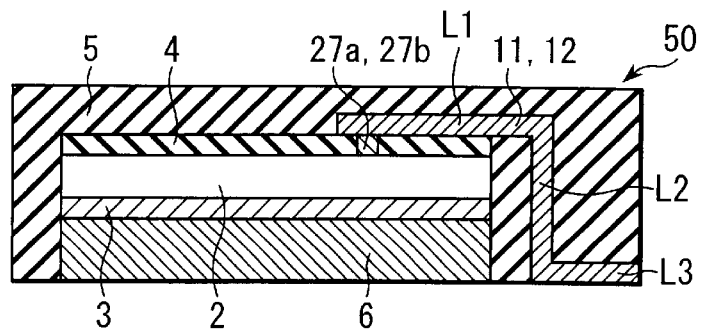
FIG. 8 is a sectional view showing a semiconductor package with a power semiconductor chip disposed therein and containing a vertical type MOS transistor, according to a second embodiment of the present invention.
Figure 9:
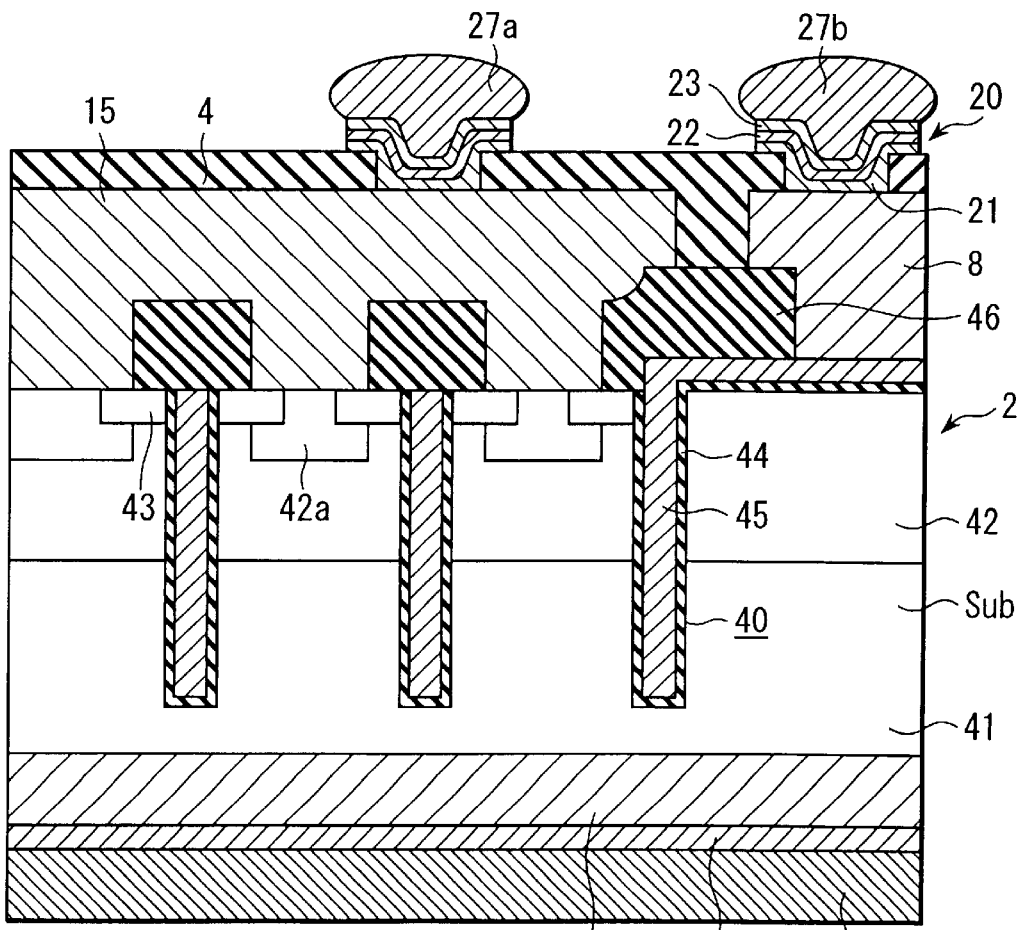
FIG. 9 is a sectional view showing the internal structure of the semiconductor chip in the semiconductor package shown in FIG. 8.

FIG. 8 is a sectional view showing a semiconductor package with a power semiconductor chip disposed therein and containing a vertical type MOS transistor, according to a second embodiment of the present invention. FIG. 9 is a sectional view showing the internal structure of the semiconductor chip in the semiconductor package shown in FIG. 8.

The semiconductor package 50 according to this embodiment includes a power semiconductor chip 2 containing a vertical type MOS transistor, as in the first embodiment. Specifically, as shown in FIG. 9, a source electrode (including a source lead-out electrode) 15 and a gate lead-out electrode 8 are disposed on the top side of the chip 2. A drain electrode 16 is disposed on the bottom side of the chip 2. The semiconductor chip 2 is mounted on a heat spreader 6 through a solder layer (a conductive bonding member) 3.

Bump contacts (conductive bonding members) 27a and 27b formed of a solder layer are disposed on the source electrode 15 and the gate lead-out electrode 8, respectively. A barrier metal laminated structure 20 formed of a Pd layer (or Au layer) 23/a Ni layer 22/a T1 layer 21 is disposed between the bump contact 27a and the source electrode 15, and between the bump contact 27b and the gate lead-out electrode 8. Where a source electrode 15 and a gate lead-out electrode 8 each formed of an aluminum film are used, a solder layer is not directly connected to the electrodes in general (it can be directly connected as the case may be). Accordingly, the barrier metal laminated structure 20 is interposed between the electrode and the solder layer, so that they are connected in a good state. The barrier metal layers 21, 22, and 23 are formed by vapor deposition, for example. The bump contacts 27a and 27b are bonded to the Pd layer, or to the Ni layer beyond the Pd layer.

First and second leads 11 and 12 each formed of a conductive strip are bonded to the bump contacts 27a and 27b, respectively. Consequently, the first lead 11 is electrically connected to the source electrode 15 through the bump contact 27a. The second lead 12 is electrically connected to the gate lead-out electrode 8 through the bump contact 27b. Since the heat spreader 6 is electrically connected to the drain electrode 16 through the solder layer 3, it functions as a third lead.

An insulating sealing body 5 is arranged to embed and seal therein the semiconductor chip 2, the solder layer 3, the heat spreader 6, the first and second leads 11 and 12, the bump contacts 27a and 27b, and so forth. The bottom face of the heat spreader 6, and the bottom faces of the foot portions L3 of the first and second leads 11 and 12 are exposed on the bottom of the sealing body 5. The bottom faces of the members 6, L3, and 5 are disposed on substantially the same horizontal plane (the mount face of the package).

FIG. 10 is a flowchart showing a method of manufacturing a semiconductor package according to the second embodiment. In the manufacturing method, the process of work-pieces is the same as that shown in FIGS. 6A to 6E.

First, a semiconductor wafer W of, e.g., silicon is prepared. On the wafer W, semiconductor devices each having a structure as described above are formed, i.e., a number of portions each functioning as a vertical type MOS transistor are formed (step S1). Then, barrier metal layers 21, 22, and 23 are formed in this order on those portions of the wafer W, which correspond to the source electrode and the gate lead-out electrode of the respective semiconductor devices (step S12). The barrier metal layers 21, 22, and 23 may be formed by vapor deposition, for example.

Then, bump contacts 27a and 27b made of solder are formed on the barrier metal layers 23 (step S13: FIG. 6A). The bump contacts 27a and 27b may be formed by a solder printing method, a solder plating method, or a solder ball providing method, for example.

Then, solder bonding of a circular plate HS for a heat spreader, a dicing operation, a facedown bonding operation, and a molding operation are performed in accordance with steps S3 to S6, as described above, so that a semiconductor package 50 is formed, as shown in FIGS. 8 and 9. In the second embodiment, since the bump contacts 27a and 27b are made of solder, the facedown bonding operation in the step S5 may be performed by a pulse heating method, for example.

With the manufacturing method of a semiconductor package 50 according to the second embodiment, it is also possible to reduce the wiring resistance and thermal resistance, which are obstacles in the properties of conventional semiconductor packages. Furthermore, with the semiconductor package 50 according to the second embodiment, it is also possible to remarkably reduce the package size, as compared to conventional semiconductor packages.

Third Embodiment

Figure 11A:
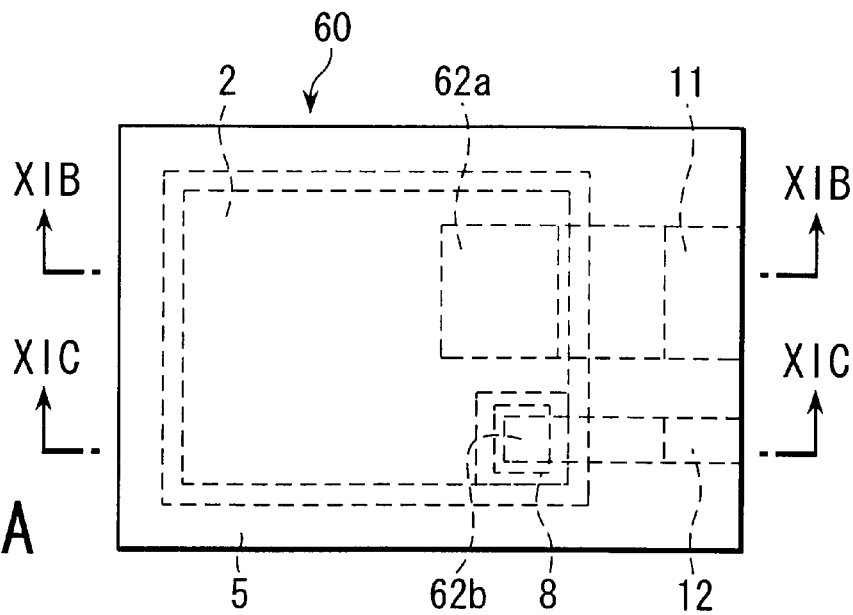
FIG. 11A is a plan view showing a semiconductor package with a power semiconductor chip disposed therein and containing a vertical type MOS transistor, according to a third embodiment of the present invention.
Figure 11B:
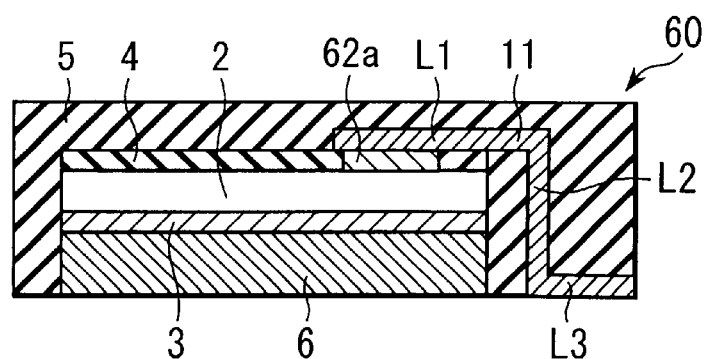
FIGS. 11B and 11C are sectional views taken along lines XIB—XIB and XIC—XIC in FIG. 11A, respectively.
Figure 11C:
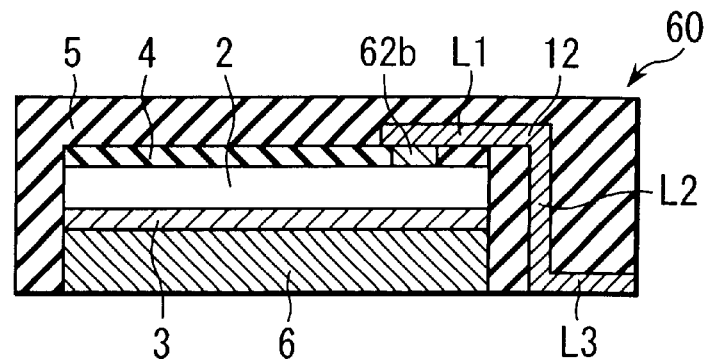
Figure 12:
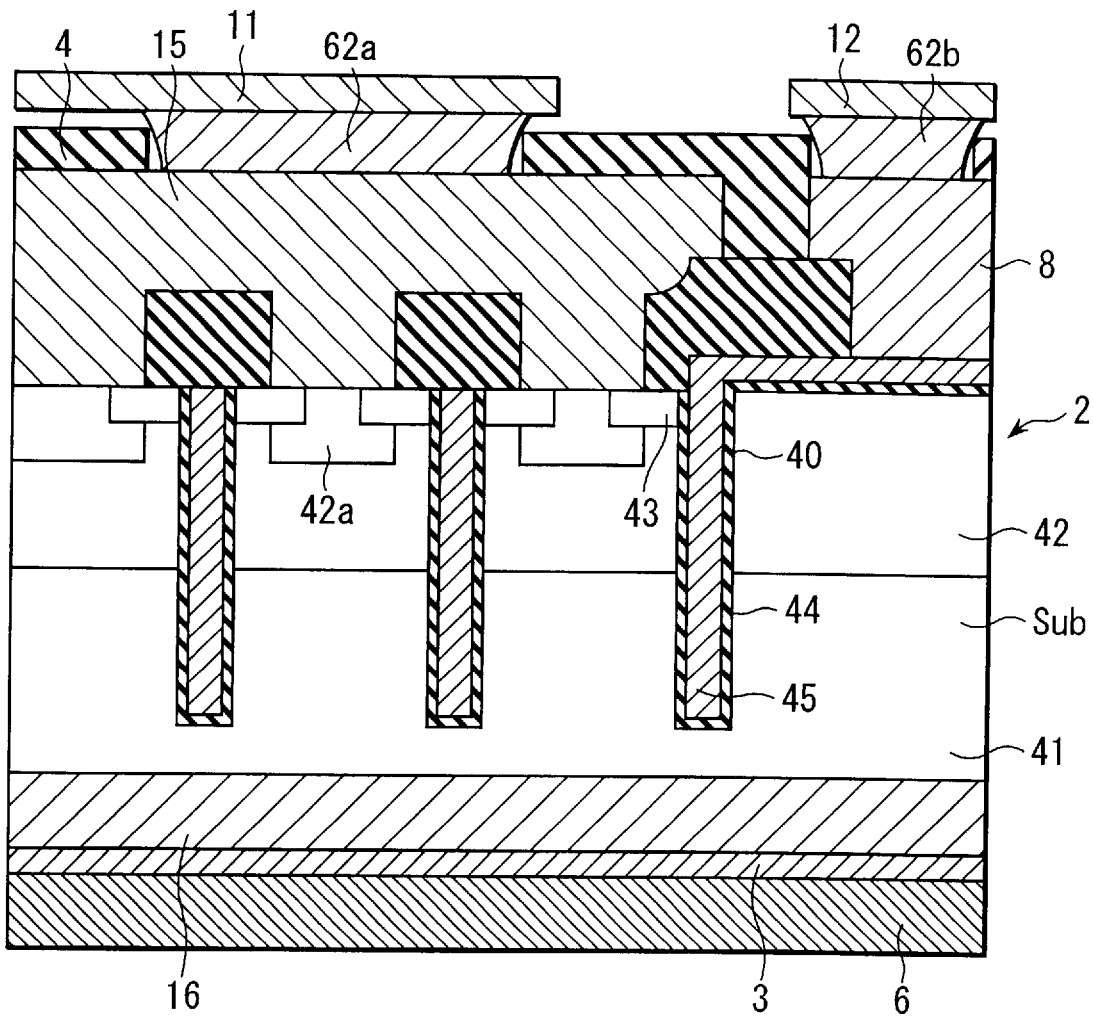
FIG. 12 is a sectional view showing the internal structure of the semiconductor chip in the semiconductor package shown in FIG. 11A.

FIG. 11A is a plan view showing a semiconductor package with a power semiconductor chip disposed therein and containing a vertical type MOS transistor, according to a third embodiment of the present invention. FIGS. 11B and 11C are sectional views taken along lines XIB—XIB and XIC—XIC in FIG. 11A, respectively. FIG. 12 is a sectional view showing the internal structure of the semiconductor chip in the semiconductor package shown in FIG. 11A.

The semiconductor package 60 according to this embodiment includes a power semiconductor chip 2 containing a vertical type MOS transistor, as in the first and second embodiments. Specifically, as shown in FIG. 12, a source electrode (including a source lead-out electrode) 15 and a gate lead-out electrode 8 are disposed on the top side of the chip 2. A drain electrode 16 is disposed on the bottom side of the chip 2. The semiconductor chip 2 is mounted on a heat spreader 6 through a solder layer (a conductive bonding member) 3.

The chip 2 is covered and protected with a passivation film 4 formed of, e.g., a silicon nitride film, in which large openings are formed at positions corresponding to the source electrode 15 and the gate lead-out electrode 8. Bonding members (conductive bonding members) 62a and 62b made of solder are disposed in the openings, such that they are connected to the respective electrodes and project upward. The bonding member 62a on the source electrode 15 has a sectional area of 0.2 mm² or more, which is far larger than those of ordinary bump contacts.

First and second leads 11 and 12 each formed of a conductive strip are bonded to the bonding members 62a and 62b, respectively. Consequently, the first lead 11 is electrically connected to the source electrode 15 through the bonding member 62a. The second lead 12 is electrically connected to the gate lead-out electrode 8 through the bonding member 62b. Since the heat spreader 6 is electrically connected to the drain electrode 16 through the solder layer 3, it functions as a third lead.

An insulating sealing body 5 is arranged to embed and seal therein the semiconductor chip 2, the solder layer 3, the heat spreader 6, the first and second leads 11 and 12, the bonding members 62a and 62b, and so forth. The bottom face of the heat spreader 6, and the bottom faces of the foot portions L3 of the first and second leads 11 and 12 are exposed on the bottom of the sealing body 5. The bottom faces of the members 6, L3, and 5 are disposed on substantially the same horizontal plane (the mount face of the package).

Figure 13:
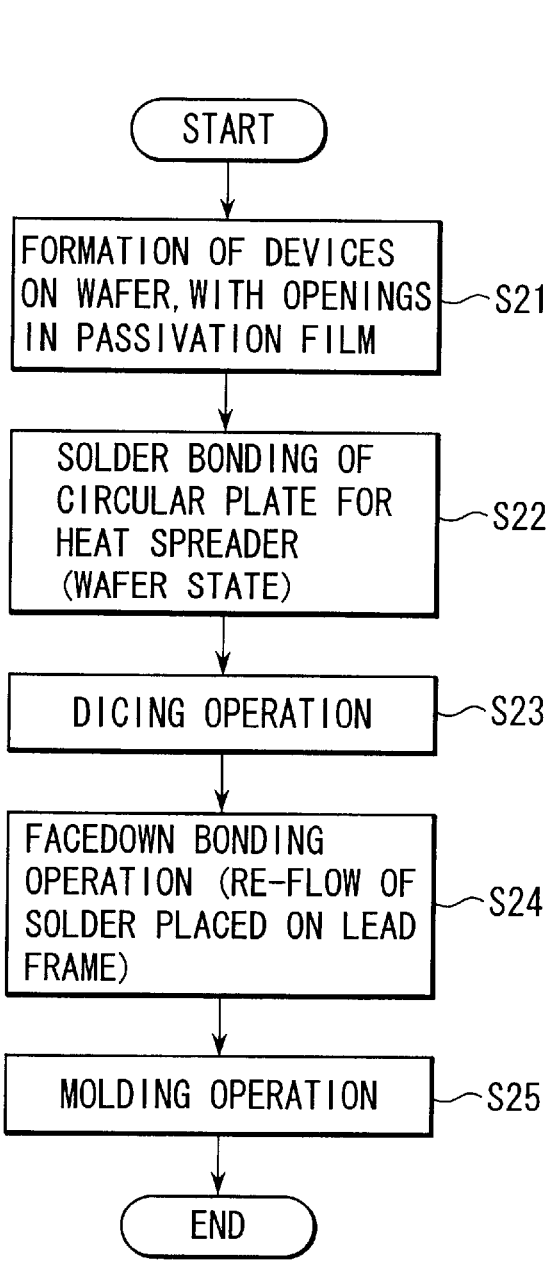
FIG. 13 is a flowchart showing a method of manufacturing a semiconductor package according to the third embodiment.

FIG. 13 is a flowchart showing a method of manufacturing a semiconductor package according to the third embodiment.

First, a semiconductor wafer W of, e.g., silicon is prepared. On the wafer W, semiconductor devices each having a structure as described above are formed, i.e., a number of portions each functioning as a vertical type MOS transistor are formed (step S11). In this step, large openings are formed in a passivation film 4 at positions of the semiconductor devices where bonding members 62a and 62b are to be formed.

Then, a circular plate used as the material of a heat spreader is solder-bonded to the bottom of the wafer W, i.e., the drain electrode of the semiconductor devices (step S22). At this time, a solder layer may be disposed on the bottom of the wafer W in advance by vapor deposition, or may be disposed on the circular plate for a heat spreader in advance by plating. Instead of the bonding performed in a wafer state, a bonding operation may be performed in a chip state after a dicing operation.

Then, the wafer W is subjected to a dicing operation along with the circular plate for a heat spreader. As a result, there are produced a number of separate intermediate structures, each of which has a semiconductor chip 2 and a heat spreader 6 bonded to each other by a solder layer 3 (step S23).

Then, the intermediate structure is boned to a lead frame used as the material of first and second leads 11 and 12 (step S24). At this time, solder layers to be bonding members 62a and 62b are first disposed on the lead frame. Then, the chip 2 is made upside down, and is positioned relative to the lead frame. In this state, the solder layers are subjected to a re-flow operation, so that the bonding members 62a and 62b are formed. By doing so, a facedown bonding operation is performed on the chip 2 relative to the lead frame.

Then, the resultant structure obtained in the step described above is provided with an insulating sealing body 5, which is formed by, e.g., a molding operation (step S25). The semiconductor chip 2, the solder layer 3, the heat spreader 6, and the first and second leads 11 and 12 are embedded and sealed in the sealing body 5 thus formed.

With the manufacturing method of a semiconductor package 60 according to the third embodiment, it is also possible to reduce the wiring resistance and thermal resistance, which are obstacles in the properties of conventional semiconductor packages. In addition, since the solder of the bonding members 62a and 62b for connecting the first and second leads 11 and 12 is directly applied in the step of a facedown bonding operation, the manufacturing method can be simplified, as compared to the first embodiment. Furthermore, with the semiconductor package 60 according to the third embodiment, it is also possible to remarkably reduce the package size, as compared to conventional semiconductor packages.

Fourth Embodiment

Figure 14:
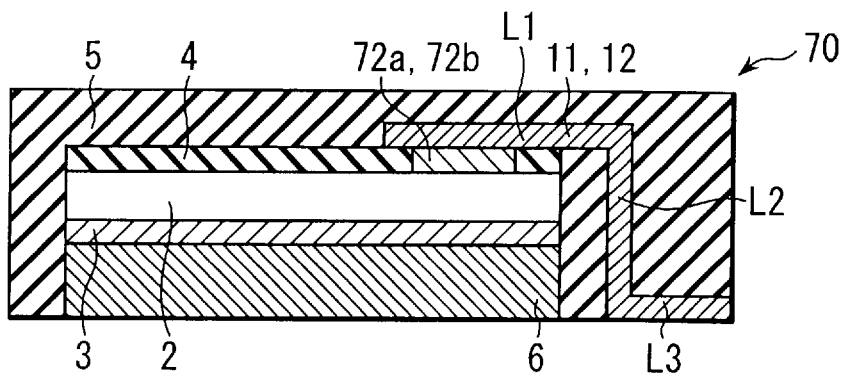
FIG. 14 is a sectional view showing a semiconductor package with a power semiconductor chip disposed therein and containing a vertical type MOS transistor, according to a fourth embodiment of the present invention.
Figure 15:
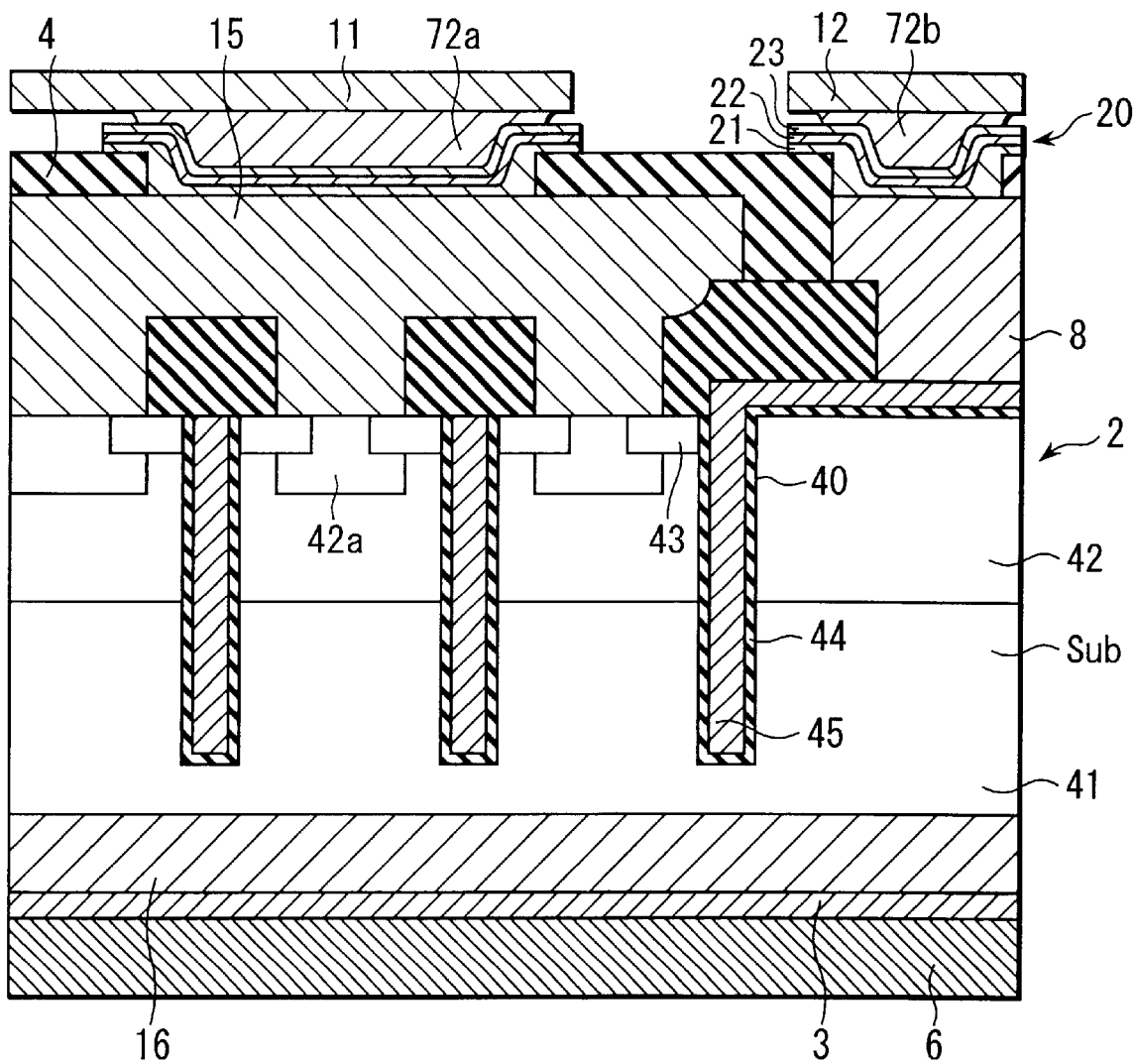
FIG. 15 is a sectional view showing the internal structure of the semiconductor chip in the semiconductor package shown in FIG. 14.
Figure 17A:
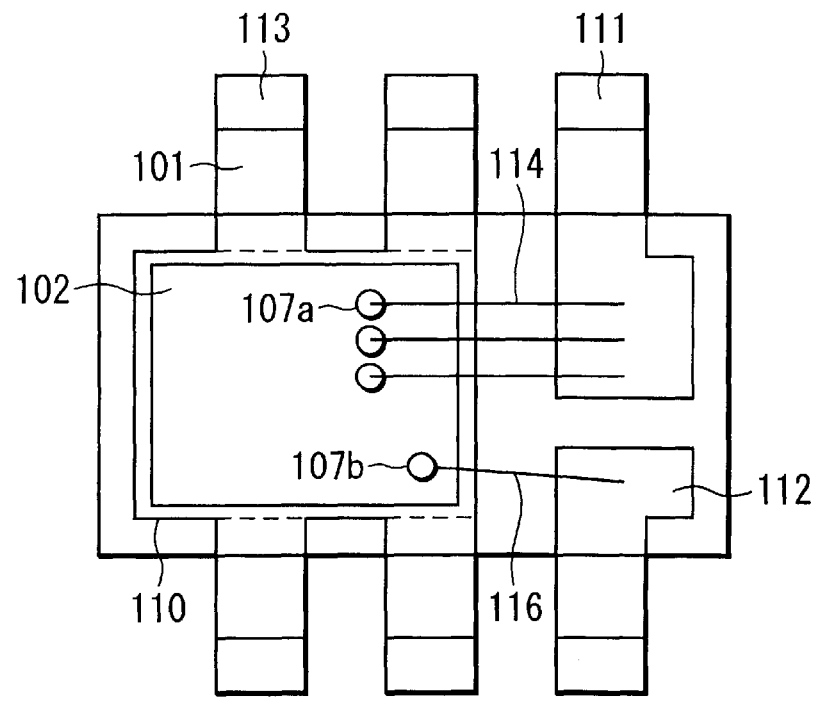
FIG. 17A is a plan view diagram showing a conventional semiconductor package with a power semiconductor chip disposed therein and containing a vertical type MOS transistor.
Figure 17B:
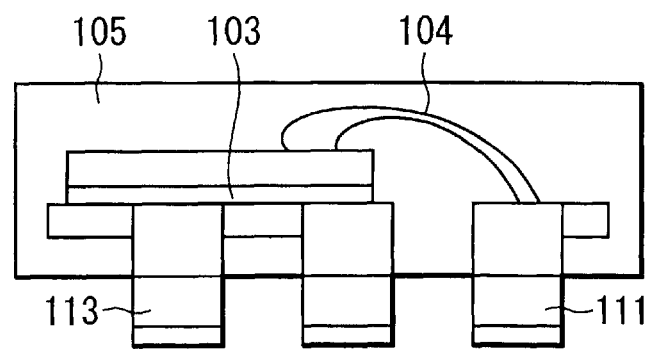
FIGS. 17B and 17C are sectional view diagrams of the semiconductor package shown in FIG. 17A, in the longitudinal direction and a direction perpendicular thereto, respectively.
Figure 17C:
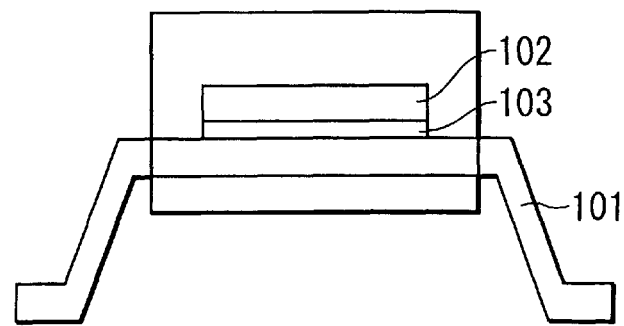

FIG. 14 is a sectional view showing a semiconductor package with a power semiconductor chip disposed therein and containing a vertical type MOS transistor, according to a fourth embodiment of the present invention. FIG. 15 is a sectional view showing the internal structure of the semiconductor chip in the semiconductor package shown in FIG. 14.

The semiconductor package 70 according to this embodiment includes a power semiconductor chip 2 containing a vertical type MOS transistor, as in the first to third embodiments. Specifically, as shown in FIG. 15, a source electrode (including a source lead-out electrode) 15 and a gate lead-out electrode 8 are disposed on the top side of the chip 2. A drain electrode 16 is disposed on the bottom side of the chip 2. The semiconductor chip 2 is mounted on a heat spreader 6 through a solder layer (a conductive bonding member) 3.

The chip 2 is covered and protected with a passivation film 4 formed of, e.g., a silicon nitride film, in which large openings are formed at positions corresponding to the source electrode 15 and the gate lead-out electrode 8. Bonding members (conductive bonding members) 72a and 72b made of solder are disposed in the openings, such that they are connected to the respective electrodes and project upward. The bonding member 72a on the source electrode 15 has a sectional area of 0.2 mm$^2$ or more, which is far larger than those of ordinary bump contacts.

A barrier metal laminated structure 20 formed of a Pd layer (or Au layer) 23/a Ni layer 22/a Ti layer 21 is disposed between the bonding member 72a and the source electrode 15, and between the bonding member 72b and the gate lead-out electrode 8. Where a source electrode 15 and a gate lead-out electrode 8 each formed of an aluminum film are used, a solder layer is not directly connected to the electrodes in general (it can be directly connected as the case may be). Accordingly, the barrier metal laminated structure 20 is interposed between the electrode and the solder layer, so that they are connected in a good state. The barrier metal layers 21, 22, and 23 are formed by vapor deposition, for example. The bump contacts 27a and 27b are bonded to the Pd layer, or to the Ni layer beyond the Pd layer.

First and second leads 11 and 12 each formed of a conductive strip are bonded to the bonding members 72a and 72b, respectively. Consequently, the first lead 11 is electrically connected to the source electrode 15 through the bonding member 72a. The second lead 12 is electrically connected to the gate lead-out electrode 8 through the bonding member 72b. Since the heat spreader 6 is electrically connected to the drain electrode 16 through the solder layer 3, it functions as a third lead.

An insulating sealing body 5 is arranged to embed and seal therein the semiconductor chip 2, the solder layer 3, the heat spreader 6, the first and second leads 11 and 12, the bonding members 72a and 72b, and so forth. The bottom face of the heat spreader 6, and the bottom faces of the foot portions L3 of the first and second leads 11 and 12 are exposed on the bottom of the sealing body 5. The bottom faces of the members 6, L3, and 5 are disposed on substantially the same horizontal plane (the mount face of the package).

Figure 16:
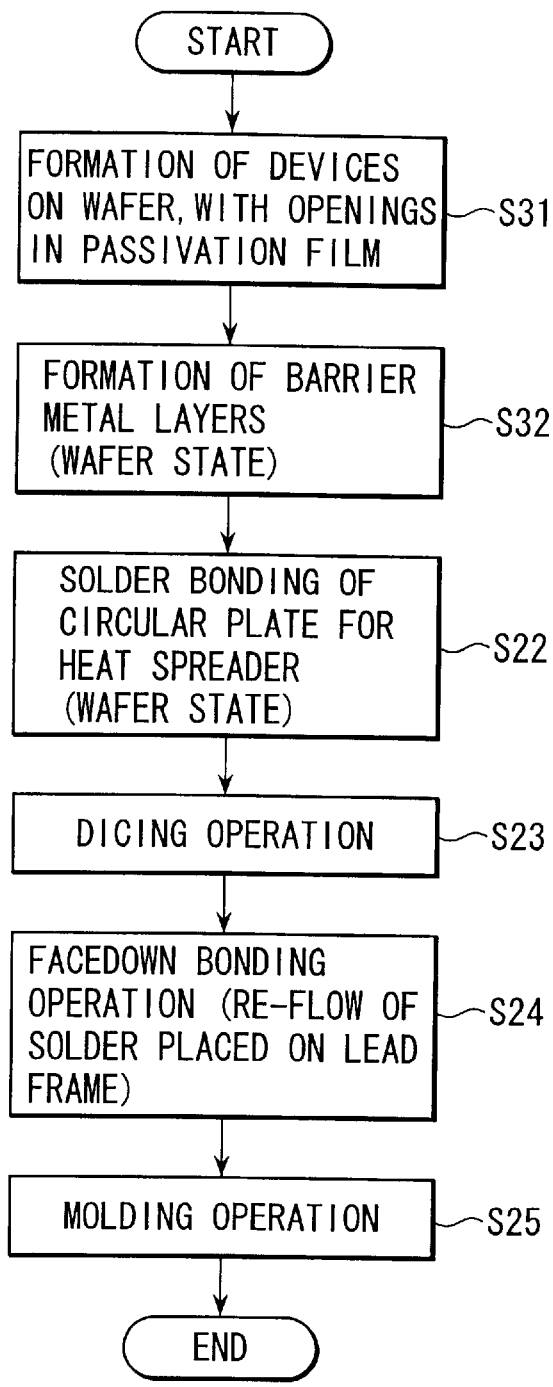
FIG. 16 is a flowchart showing a method of manufacturing a semiconductor package according to the fourth embodiment.

FIG. 16 is a flowchart showing a method of manufacturing a semiconductor package according to the fourth embodiment.

First, a semiconductor wafer W of, e.g., silicon is prepared. On the wafer W, semiconductor devices each having a structure as described above are formed, i.e., a number of portions each functioning as a vertical type MOS transistor are formed (step S31). In this step, large openings are formed in a passivation film 4 at positions of the semiconductor devices where bonding members 72a and 72b are to be formed. Then, barrier metal layers 21, 22, and 23 are formed in this order on those portions corresponding to the large openings formed in the passivation film 4 (step S32). The barrier metal layers 21, 22, and 23 may be formed by vapor deposition, for example.

Then, solder bonding of a circular plate for a heat spreader, a dicing operation, a facedown bonding operation, and a molding operation are performed in accordance with steps S22 to S25, as described above, so that a semiconductor package 70 is formed, as shown in FIGS. 14 and 15.

With the manufacturing method of a semiconductor package 70 according to the fourth embodiment, it is also possible to reduce the wiring resistance and thermal resistance, which are obstacles in the properties of conventional semiconductor packages. In addition, since the solder of the bonding members 72a and 72b for connecting the first and second leads 11 and 12 is directly applied in the step of a facedown bonding operation, the manufacturing method can be simplified, as compared to the second embodiment. Furthermore, with the semiconductor package 70 according to the fourth embodiment, it is also possible to remarkably reduce the package size, as compared to conventional semiconductor packages.

In the first to fourth embodiments, a semiconductor device contained in the power semiconductor chip is exemplified by a vertical type MOS transistor, but the semiconductor device may be formed of another device, such as an IGBT (Insulated Gate Bipolar Transistor).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor package, comprising:
    a semiconductor chip including first and second electrodes disposed on a top side, and a third electrode disposed on a bottom side;
    a heat spreader bonded to the third electrode;
    first and second conductive leads electrically connected to the first and second electrodes through first and second conductive bonding members, respectively, the first and second leads respectively including foot portions, which laterally extend at lower ends of the first and second leads and are juxtaposed on a first side of the heat spreader; and
    an insulating sealing body arranged to embed and seal therein the semiconductor chip, the heat spreader, and portions of the first and second leads, which extend from the first and second bonding members to at least part of the foot portions, the heat spreader and the foot portions of the first and second leads having bottom faces, which are exposed on a bottom of the sealing body, and are disposed on substantially the same plane.

2. A package according to claim 1, wherein the heat spreader is conductive, and is electrically connected to the third electrode through a third conductive bonding member, the heat spreader functioning as a third lead.

3. A package according to claim 1, wherein the first, second, and third electrodes are electrically connected to source electrode, gate electrode, and drain electrode, respectively.

4. A package according to claim 1, wherein foot portions of all leads including the first and second leads, which are connected to the top side of the semiconductor chip, are juxtaposed on the first side of the heat spreader.

5. A package according to claim 1, wherein the first and second leads are sole terminals configured to receive first and second voltages, respectively, applied to the semiconductor chip.

6. A package according to claim 1, wherein each of the first and second leads is formed of a conductive strip.

7. A package according to claim 6, wherein the heat spreader has a thickness $t1$ and the conductive strip has a thickness $t2$ to satisfy a thickness ratio condition of $1<t1/t2\leq3$.

8. A package according to claim 1, wherein the sealing body is formed to embed and seal therein substantially entirely the foot portions of the first and second leads, while allowing a toe of each of the foot portions to be exposed on a side surface of the sealing body.

9. A package according to claim 8, wherein the toe of each of the foot portions projects from the side surface of the sealing body by a length of from 0 to 0.3 mm.

10. A package according to claim 1, wherein each of the first and second leads comprises a proximal portion facing the top side of the semiconductor chip, a leg portion bending from the proximal portion and extending along a flank of the semiconductor chip and the heat spreader, and the foot portion bending from the leg portion and extending away from the heat spreader.

11. A package according to claim 10, wherein the sealing body is formed to embed and seal therein the semiconductor chip, the heat spreader, and all the proximal portions and the leg portions of the first and second leads, and at least part of the foot portions of the first and second leads.

12. A package according to claim 10, wherein the leg portion forms an angle of $90°\pm10°$ relative to the plane.

13. A package according to claim 1, wherein each of the first and second bonding members comprises a bonding member having a sectional area of from 0.007 to 0.07 mm$^2$.

14. A package according to claim 1, wherein at least one of the first and second bonding members comprises a bonding member having a sectional area of 0.2 mm$^2$ or more.

15. A package according to claim 1, wherein the sealing body consists essentially of a material selected from the group consisting of thermosetting resins including epoxy resin.

16. A package according to claim 1, wherein each of the first and second bonding members consists essentially of a material selected from the group consisting of Au and solder.

17. A package according to claim 16, further comprising barrier metal layers respectively interposed between the first and second electrodes and the first and second bonding members, wherein the first and second bonding members consists essentially of solder.

18. A package according to claim 1, wherein the heat spreader consists essentially of a material different from that of the first and second leads.

19. A method of manufacturing a semiconductor package comprising:

bonding a heat spreader to a third electrode of a semiconductor chip, which includes first and second electrodes disposed on a top side, and the third electrode disposed on a bottom side electrically connecting first and second conductive leads to the first and second electrodes by first and second conductive bonding members, respectively, the first and second leads respectively including foot portions, which laterally extend at lower ends of the first and second leads and are juxtaposed on a first side of the heat spreader; and forming an insulating sealing body to embed and seal therein the semiconductor chip, the heat spreader, and portions of the first and second leads, which extend from the first and second bonding members to at least part of the foot portions, the heat spreader and the foot portions of the first and second leads having bottom faces, which are exposed on a bottom of the sealing body, and are disposed on substantially the same plane.

20. A method according to claim 19, further comprising placing materials of the first and second bonding members on the first and second electrodes, before electrically connecting the first and second leads, and before bonding the heat spreader.

21. A method according to claim 19, wherein electrically connecting the first and second leads is performed by a facedown bonding operation.

22. A method according to claim 21, further comprising placing materials of the first and second bonding members on the first and second leads, before electrically connecting the first and second leads.

23. A method according to claim 19, wherein the heat spreader is conductive, and is electrically connected to the third electrode through a third conductive bonding member, the heat spreader functioning as a third lead.

24. A method according to claim 19, wherein the first and second leads are part of a lead frame, and the method further comprises separating the first and second leads from the lead frame, after connecting the first and second leads to the first and second electrodes, respectively.

25. A semiconductor package, comprising:

a semiconductor chip including first and second electrodes disposed on a top side, and a third electrode disposed on a bottom side;

a conductive heat spreader bonded to the third electrode, the heat spreader being electrically connected to the third electrode through a third conductive bonding member, and functioning as a third lead;

first and second conductive leads electrically connected to the first and second electrodes through first and second conductive bonding members, respectively, wherein each of the first and second leads is formed of a conductive strip, and the heat spreader has a thickness $t1$ and the conductive strip has a thickness $t2$ to satisfy a thickness ratio condition of $1<t1/t2\leq3$, wherein each of the first and second leads comprises a proximal portion facing the top side of the semiconductor chip, a leg portion bending from the proximal portion and extending along a flank of the semiconductor chip and the heat spreader, and a foot portion bending from the leg portion and extending away from the heat spreader, and wherein the foot portions of the first and second leads are juxtaposed on a first side of the heat spreader; and an insulating sealing body arranged to embed and seal therein the semiconductor chip, the heat spreader, and all the proximal portions and the leg portions of the first and second leads, and at least part of the foot portions of the first and second leads, wherein the sealing body consists essentially of a material selected from the group consisting of thermosetting resins including epoxy resin, and wherein the heat spreader and the foot portions of the first and second leads have bottom faces, which are exposed on a bottom of the sealing body, and are disposed on substantially the same plane.

26. A package according to claim 25, wherein the first and second leads a r e sole terminals configured to receive first and second voltages, respectively, applied to the semiconductor chip.

27. A package according to claim 26, wherein the first, second, and third electrodes are electrically connected to source electrode, gate electrode, and drain electrode, respectively.

28. A package according to claim 25, wherein the sealing body is formed to embed and seal therein substantially entirely the foot portions of the first and second leads, while allowing a toe of each of the foot portions to be exposed on a side surface of the sealing body.

* * * * *